United States Patent [19]

Pelc

[11] Patent Number: 5,195,525
[45] Date of Patent: Mar. 23, 1993

[54] NONINVASIVE MYOCARDIAL MOTION ANALYSIS USING PHASE CONTRAST MRI MAPS OF MYOCARDIAL VELOCITY

[76] Inventor: Norbert J. Pelc, 490 Distel Dr., Los Altos, Calif. 94022

[21] Appl. No.: 617,904

[22] Filed: Nov. 26, 1990

[51] Int. Cl.[5] ............................................ A61B 5/055
[52] U.S. Cl. ................... 128/653.2; 324/309
[58] Field of Search .................. 128/653.2, 653.3; 324/309

[56] References Cited

U.S. PATENT DOCUMENTS 4,710,717 12/1987 Pelc et al. ................... 128/653.2
5,042,485 8/1991 Sano et al. ................... 128/653.2

OTHER PUBLICATIONS

M. O'Donnell "NMR Blood Flow Imaging Using Multiecho, Phase Contrast Sequences," *Med. Phys.*, 12(1), Jan./Feb. 1985.

Elias A. Zerhouni "Human Heart: Tagging with MR Imaging—A Method for Noninvasive Assessment of Myocardial Motion[1]," *Radiology*, Oct. 1988; 169:59-63.

Leon Axel, PhD, MD, et al., "MR Imaging of Motion with Spatial Modulation of Magnetization[1]," *Radiology*, vol. 171:841-945, Jun. 1989.

Charles E. Spritzer, et al. "Rapid MR Imaging of Blood Flow with a Phase-Sensitive, Limited-Flip-Angle, Gradient Recalled Pulse Sequence: Preliminary Experience[1]," *Radiology*, 176:255-262, Jul. 1990.

Van J. Wedeen, et al. "Measurement of Myocardial Strain with Phase Sensitive MR," Proceedings of Soc. Mag. Res in Med. Meeting, Aug. 18-24, 1990.

*Primary Examiner*—Lee S. Cohen
*Assistant Examiner*—K. M. Pfaffle
*Attorney, Agent, or Firm*—Townsend and Townsend

[57] ABSTRACT

Motion and deformation is assessed and imaged using phase contrast magnetic resonance imaging for determining velocity of a plurality of regions at a plurality of frames during a period of interest such as the cardiac cycle. A region of interest is tracked from frame to frame and based on a known last position and the velocity at the known position. Strain and rotation are determined from the changes in velocity along selected axes.

23 Claims, 4 Drawing Sheets

NONINVASIVE MYOCARDIAL MOTION ANALYSIS USING PHASE CONTRAST MRI MAPS OF MYOCARDIAL VELOCITY

BACKGROUND OF THE INVENTION

This invention relates generally to nuclear magnetic resonance imaging (MRI), and more particularly the invention relates to motion analysis and imaging of an organ such as the heart using phase contrast MRI maps of tissue velocity in the organ.

Assessment of the motion of the heart muscle, myocardial motion, is fundamental to the characterization of certain cardiac pathologies and to the development and evaluation of successful interventions.

Echocardiography has become the preferred method for clinical studies of myocardial dynamics, providing local measures of both wall motion and thickening. The basic shortcoming of echocardiography and other tomographic techniques including CT and conventional MRI is that they use a fixed external reference system and are unable to track an individual segment of myocardium. With these methods, the myocardium present in a fixed imaging plane is imaged. Thus, the myocardial tissue seen within this imaging plane may actually represent different samples of tissue throughout the cardiac cycle. One result is that the measure wall motion and thickening may be in error. The accurate identification of specific points fixed in the myocardium provides an appropriate solution to this limitation. One method capable of providing this information uses implanted radiopaque markers but is very invasive.

Magnetic resonance imaging (MRI) is a noninvasive method which has been shown to provide accurate measures of global myocardial function, ventricular volumes, and regional wall thickening. MRI can provide similar information to echocardiography in virtually any imaging plane as it does not suffer the limitation of requiring an acoustic window. In addition, MRI provides full field anatomical images and is less dependent on operator skill. One MRI method that has been found to be very useful in studies of the heart is called CINE MRI, and is described in U.S. Pat. No. 4,710,717. Briefly, with this method, data are acquired at rapid rates and the incrementation of the amplitude of the phase encoding gradient is controlled using a physiological trigger, e.g. EKG. While this occurs, the temporal position within the cardiac cycle at which each echo was acquired is also measured. Using this timing information and interpolation methods, images that portray the appearance of the object throughout the cardiac cycle can be formed. While useful for cardiac studies, these images still suffer from the disadvantages described above.

MRI images typically have an image intensity dependent on spin density and relaxation effects. However, methods that produce images whose intensity is proportional to velocity have also been demonstrated. See, for example, O'Donnell, *Med. Physics*, 12: 59–64, 1985; Spirtzer *Radiology*, 176: 255–262, 1990, and Nayler et al., *J. Computer Assisted Tomography*, 10: 715–722, 1986. These methods generally belong to the class of methods called phase contrast MRI. Copending U.S. patent application Ser. No. 07/564,945, filed Aug. 9, 1990, for Encoding For NMR Phase Contrast Flow Measurement, discloses a particularly useful and efficient method for simultaneously measuring the three components of velocity, as well as an apparatus with which the method can be performed. Phase contrast principles have been combined with the cine imaging method described above to enable the production of images that portray the distribution of velocities at multiple points in the cardiac cycle.

The recently introduced myocardial tagging method with MRI, however, offers a noninvasive technique for obtaining information about the motion of specific myocardial sites similar to that derived from implanted markers. See Zerhouni et al., "Human Heart: Tagging with MR Imaging—A method for Noninvasive Assessment of Myocardial Motion", *Radiology* 1988; 169:59–63, and Axel, "MR Imaging of Motion with Spatial Modulation of Magnetization", *Radiology* 1989; 171:841–845.

However, there are several shortcomings to the current implementations of the MRI based myocardial tagging techniques. Their use with spin echo imaging intrinsically limits temporal resolution and extends exam time such that true 3D data is difficult to obtain. The thickness, number and spacing of "sat bands" limits the spatial resolution of myocardial motion analyses. The resolution of motion analysis is further limited by the spatial resolution of the images. Methods of visualizing motion in all three dimensions have yet to be demonstrated. Analysis of these data require sophisticated pattern recognition algorithms or manual intervention. Finally, the contrast of the tags decays due to $T_1$ relaxation, thereby making examination of the entire cardiac cycle difficult.

Wedeen (*Proc. of Soc. Mag. Res. in Med.*, August 1990, p. 462) has shown that parameters related to strain can be derived from MRI maps of velocity. However, only a single time frame is treated and no teaching is presented as to how multiple time frames may be combined. Further, the paper does not recognize the presence of rigid rotation nor exploits information about translations.

SUMMARY OF THE INVENTION

The present invention is directed to an improved method of assessing myocardial motion, for example, using a recursive technique for determining motion, velocity, rotation, and shear in selected regions with motion resolution that is limited only by noise, without the fading problems of MR tagging, and without need for sophisticated pattern recognition algorithms. In contrast to both prior art tagged MRI and marker methods, an order of magnitude more myocardial regions can be tracked and these can be selected retrospectively. The availability of relatively high resolution 3D motion analysis of the human myocardium will provide noninvasively data on torque, twist, shear and motion in normal and pathologic conditions. For the first time noninvasive studies of the right ventricle will be available. The potential of noninvasively studying patients pre- and post-intervention will afford an important opportunity to evaluate various therapies and best predict those patient populations which will benefit from a specific therapy. The basic physiologic information about the natural history of complex congenital heart disease available noninvasively may improve the selection and timing of therapy.

Accordingly, an object of the invention is an improved apparatus and method of assessing and imaging motion of an organ noninvasively.

Another object of the invention is an improved apparatus and method of assessing myocardial motion by phase contrast magnetic resonance techniques.

A feature of the invention is the assessment of motion of an organ by determining position, velocity and deformations of small portions of the organ as a function of time.

The invention and objects and features thereof will be more readily apparent from the following detailed description and appended claims when taken with the drawings.

DETAILED DESCRIPTION OF ILLUSTRATIVE EMBODIMENTS

Figure 1A:
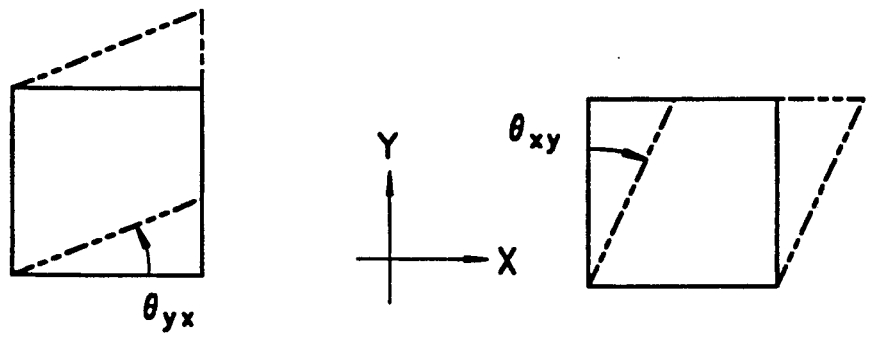
FIGS. 1A and 1B illustrate shear strains as functions of velocity derivatives.

MR data acquisitions produce images in which each picture element (pixel) is a complex quantity having a magnitude and a phase. The magnitude corresponds to the magnitude of the net transverse magnetization in a volume element. In conventional MRI, the phase is not of interest and is typically discarded.

Well before the development of imaging with NMR, it was known that magnetic field gradients can be used to encode motion information into the phase of the NMR signal since, as the spins move, they experience a changing magnetic field. Suppose an object is moving in the x direction and its position as a function of time is expanded as a Taylor series:

$$x(t) = x_o + vt + at^2/2 + \ldots \quad [1]$$

where $x_o$, $v$ and $a$ are the position, velocity, and acceleration, respectively, at time $t=0$. It can be shown that the spin's phase at time $t'$ due to the presence of the x magnetic field gradient $G_x$ is:

$$\Delta\phi(t') = \gamma M_o x_o + \gamma M_1 v + \gamma M_2 a/2 + \ldots \quad [2]$$

where $\gamma$ is the gyromagnetic ratio, an $M_0$, $M_1$ and $M_2$ are the zeroeth, first, and second moments of the gradient waveform, respectively:

$$M_o = \int_0^{t'} G_x(t)dt, \quad M_1 = \int_0^{t'} G_x(t)t\,dt, \quad M_2 = \int_0^{t'} G_x(t)t^2 dt \quad [3]$$

This ignores the potential presence of static phase shifts due, for example, to magnetic field inhomogeneities. The $M_o$ term in eq. 1 is responsible for spatial localization. Measurements at various levels of $M_o$ separate the NMR signal into components at different values of x (i.e. different positions) through the use of a Fourier transform. Thus, the $M_o$ term is taken into account in image construction and the phase shifts observed in images are due to the remaining terms:

$$\Delta\phi(t') = \gamma M_1 v + \gamma M_2 a/2 + \ldots \quad [4]$$

To eliminate the effects of static inhomogeneities, subtractions of measurements made with different first moments are used. If it is assumed that acceleration and higher order motions and/or the second and higher order moments are small, then the observed phase shift is proportional to velocity. The proportionality constant is $\gamma \Delta M_1$, where $\Delta M_1$ is the change in the first moment. $\gamma \Delta M_1$ has dimensions of phase per unit velocity and is referred to as the flow or motion encoding. Note that the proportionality constant, $\gamma \Delta M_1$, is completely determined by the parameters of the NMR experiment and are known to high accuracy. Thus, if this phenomenon is exploited for the measurement of velocity, it provides an absolute measurement of velocity that requires no artificial calibration or external standard.

Myocardial Tracking

Phase contrast cine images of single direction (e.g. x) motion yield pixel by pixel maps of velocity in this direction at regular intervals throughout the cardiac cycle. These data enable recursive derivation of the spatial trajectory of myocardial samples as small as one pixel. A small region of interest (ROI) selected on frame 1 yields the location of the sample in that frame. This, added to the product of the sample's velocity derived from the pixel values in the image in that frame and the time between frames, $\Delta t$, yields an estimate of the expected location of the sample at the second frame. This process can be repeated to generate the path of the sample recursively throughout the entire cycle.

The recursive myocardial motion tracking is generalized to 3 dimensions by treating the images of the three velocity components at a single time, t, in the cardiac cycle as providing a map of the velocity vector $\vec{v} = (v_x, v_y, v_z)$ at each pixel at that point in time $\vec{v}(x, y, z, t)$. Letting $\vec{r} = (x, y, z)$, this can also be written $\vec{v}(\vec{r}, t)$. From the location of the sample in the i-th frame, $\vec{r}_i = (x_i, y_i, z_i)$, at time $t_i$ the location in frame i+1, $\vec{r}_{i+1}$, is calculated:

$$\vec{r}_{i+1} = \vec{r}_i + \vec{v}(\vec{r}_i, t_i)\Delta t$$

It will be clear to those skilled in the art that the recursive integration in the above equation can also be performed in the opposite direction:

$$\vec{r}_{i-1} = \vec{r}_i - \vec{v}(\vec{r}_i, t_i)\Delta t$$

The precision of the resulting trajectory depends on the precision of the velocity estimates. Thus, while single pixel trajectories can be used, enhanced precision can be achieved as the size of the region is increased if the average is used. This average is the average motion of the region, so the ROI should not be so large as to include structures with grossly different behavior. Although the volume is selectable and is limited at the low end to much less than 0.1 cc, regions with volumes of less than 0.25 cc are preferred for the study of myocardial motion.

Spatial Resolution Considerations

The spatial resolution of the velocity maps presently available in accordance with the phase contrast technique of this invention is 1 to 2 mm in-plane by 3 to 10 mm slice thickness. These dimensions are coarse compared to the information desired, however the phase contrast technique can measure sub-pixel displacements and corresponding distortions to a degree that is not limited by the spatial resolution. Each pixel of each frame contains information about the velocity of a point at the center of the pixel. The product of this velocity and the frame duration time yields the displacement that occurs during one frame. The precision and accuracy of the estimated displacement are limited only by the precision and accuracy of the velocity estimate. If the velocity estimate is representative of that experienced by the point over the frame time, the spatial resolution of the velocity map is of no consequence. The location of the sample at the time of the next frame is thus estimated to a fraction of pixel. To calculate the displacement over the next frame an estimate of the velocity of the sample in the next frame is needed. From the image data this can be obtained by interpolation (e.g. cubic, linear or nearest neighbor), and this estimated velocity can be used to calculate the incremental displacement. The validity of this estimate again depends on the degree to which the estimated velocity is appropriate for the sample. This will be acceptable as long as the image resolution is sufficient to characterize the spatial variations of velocity in the myocardium.

Deformations

While the ability to track an individual myocardial sample can be very useful, often the physiologic information is contained in the local deformations. For example, as the heart contracts the muscle is expected to shorten in some directions, thicken in others as well as experience shear deformations. It is known from invasive studies that ischemic muscle does not behave as expected, and either does not deform or exhibits deformations opposite of those expected in healthy muscle.

Since position data for a large number of points can be generated, each equivalent to a radiopaque marker, it is possible to generate measurements of segmental shortening, wall thickening, shear strain, and torsion. This can be accomplished by selection of multiple ROI's in a diastolic frame at the desired locations, tracking their positions throughout the cardiac cycle, and analyzing these data as is done with markers. However, a more direct approach for calculation of some parameters (e.g. strain) with phase contrast MRI data has been discovered.

For the simple case of motion in one direction (x), a segment of length L. oriented in x and moving rigidly throughout the cardiac cycle would be demonstrated by phase contrast MRI to have a measured velocity distribution ($v_x$) which is uniform (but non-zero and time varying) along the segment. In a segment undergoing deformation the velocity along the segment is spatially non-uniform. Information about deformation (strain) is contained in the spatial gradient or slope of the velocity, $dv_x/dx$. Consider the i-the time frame and let the segment extend from $x_o$ to $(x_o+L)$. If the velocity at $x_o$ is $v_o$, the velocity at $(x_o+L)$ is $\{v_o+L(dv_x/dx)\}$. If these points continue at these velocities for a frame time $\Delta t$, their distance will grow by an amount $\Delta L = L(dv_x/dx)\Delta t$. The strain developed during this frame, $\epsilon_{xx}$, then is:

$$\epsilon_{xx} = \Delta L/L = (dv_x/dx)\Delta t$$

Positive $\epsilon_{xx}$ indicates that the segment underwent lengthening during this frame while negative $\epsilon_{xx}$ represents shortening. In continuous variable, we see that $dv_x/dx = d\epsilon_{xx}/dt$. Thus, the x directed spatial derivative of $v_x$ in each time frame is the temporal derivative, or the development rate of x directed longitudinal strain.

Strain development rates in other directions can also be calculated with:

$$dv_y/dy = d\epsilon_{yy}/dt \text{ and}$$

$$dv_z/dz = d\epsilon_{zz}/dt.$$

Shear strain development rate can be estimated as well. For example, for a 2 dimensional map of 2 dimensional velocity, i.e. $v_x(x,y)$ and $v_y(x,y)$ two types of shear deformations are possible, denoted $\theta_{xy}$ and $\theta_{yx}$, and defined as the deformation angles, with positive directions as in FIG. 1A.

Following derivation steps similar to those above, it can be shown that the rate of development of these shear strains are:

$$d\theta_{yx}/dt = dv_y/dx \text{ and}$$

$$d\theta_{xy}/dt = dv_x/dy$$

In general, both types of shear motion may be present simultaneously, i.e. $dv_x/dy$ and $dv_y/dx$ being non-zero simultaneously.

Figure 1B:
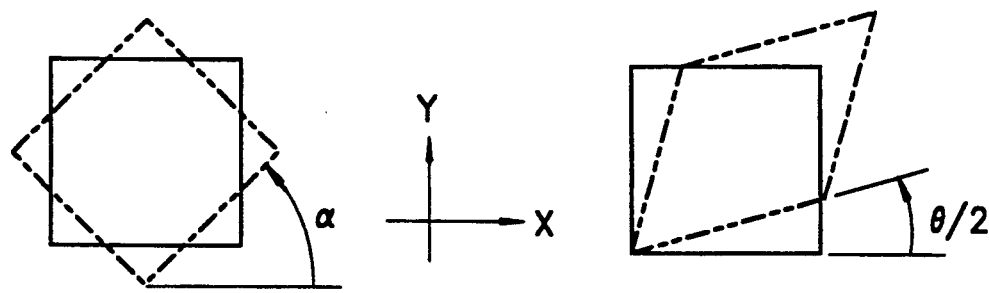

Motions of this type are actually composed of two more readily understood motions. In pure shear $\theta_{xy}$ must equal $\theta_{yx}$, while if $\theta_{xy} = \theta_{yx}$ the object is exhibiting a rigid rotation and is not deforming at all. These motions are shown in FIG. 1B. Thus, from the two derivatives $dv_x/dy$ and $dv_y/dx$ we can compute the rate of rotation $d\alpha/dt$ and the rate of development of pure shear $d\theta/dt$:

$$d\alpha/dt = \frac{1}{2}(dv_y/dx = dv_x/dy)$$

$$d\theta/dt = (dv_y/dx - dv_x/dy)$$

The shear angle as defined in FIG. 1B may seem unusual, as the angle from the axes is $\theta/2$. However, this definition insures that, for example, $\theta = \theta_{xy}$ if $\theta_{yx} = 0$.

Summarizing these results for analysis of 2 dimensional data, the average values of the x and y velocities in a region are related to the motion of the region. The combination $(dv_y/dx - dv_x/dy)$ is related to rigid rotation of the region. $dv_x/dx$ and $dv_y/dy$ are related to the rate of development of longitudinal strain and $(dv_y/dx + dv_x/dy)$ is the rate of development of pure shear strain.

This formulation is readily generalized to three dimensional motion, rotation and deformation.

From images of the three velocity components at a single time frame, images of the spatial derivatives of velocity can be made and depict the spatial distribution of the rate of development of these deformations. For example, an image of $dv_x/dx$ depicts the spatial distribution of the development rate of x directed longitudinal strain. Bright pixel values indicate regions that are lengthening in the x direction in this time frame while dark (negative) pixel values represent the rate of shortening. Similarly, images of other longitudinal and shear strain development rates can be formed. When displayed in movie format, these images can depict how the myocardial contraction propagates in space and time.

Regional Strain

Calculations of the strain development rate are combined with the myocardial tracking method to estimate the total strain developed during all or a portion of the cardiac cycle. For a myocardial region identified in the end-diastolic frame, the velocity map in each frame is used recursively to track the region from frame to frame. The velocity gradients within the (moving) region in each frame are used to calculate the development rate for each of the strain components in each frame, and these are summed to yield the total strains. This process is continued throughout the cardiac cycle to estimate the longitudinal and shear strains within a small volume of myocardium. From these, the principal strains and the direction of greatest shortening are calculated. The shape and location of the myocardial regions can be arbitrarily selected with a minimum size of at least 2 pixels in each direction of interest to allow calculation of derivatives.

When combining deformation contributions from multiple time frames it is important to maintain a consistent and rational coordinate system. For example, suppose that in one time frame the muscle fibers are directed in the x direction and local contraction is reflected in the x directed strain. Also suppose that, due to the action of surrounding muscle, the region being examined is rotating. In the next time frame, strain development rates are again computed. However, prior to being combined with those of the first frame, the results of this second frame must be rotated back into alignment with those of the first.

Figure 2:
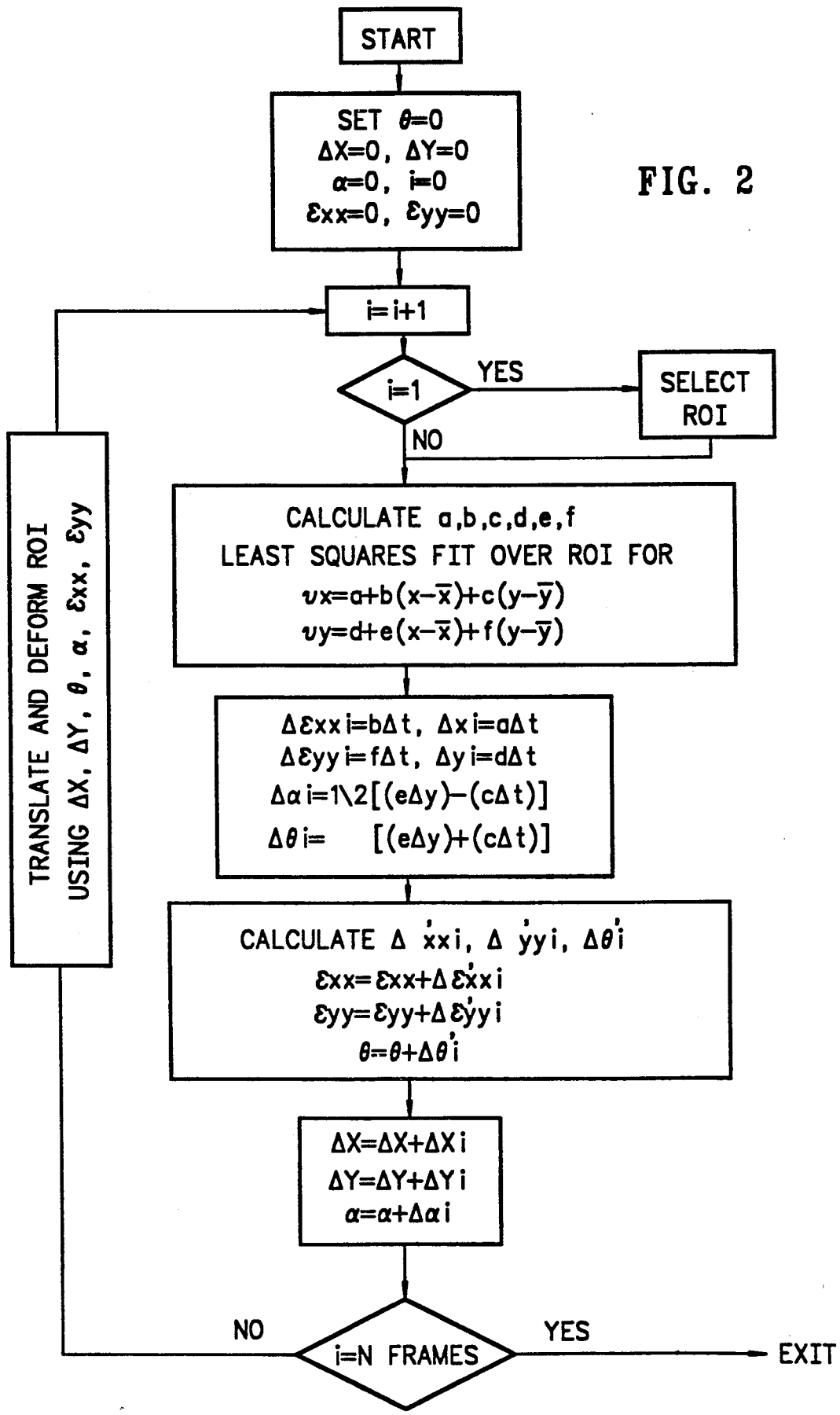
FIG. 2 is a flow diagram of a method of calculating motion of tissue in an organ over time in accordance with an embodiment of the invention.

FIG. 2 is a flow diagram illustrating the steps in calculating total motion and deformation of a region of interest over an interval of time based on velocity measurements of the region at different frames during the time interval. For the sake of clarity of description is limited to 2 dimensional motion, but extension to 3 dimensional motion will be clear to those skilled in the art. Initially, the rotation angle, $\alpha$, the x and y displacements, $\Delta x$ and $\Delta y$, shear ($\theta$), and longitudinal strain ($\epsilon_{xx}$, $\epsilon_{yy}$) are set to zero, as is the frame counter i.

For the first frame (i=1), the region of interest (ROI) must be selected.

In each time frame, the velocities within the ROI are modelled as:

$$v_x = a + b(x - \bar{x}) + c(y - \bar{y})$$

$$v_y = d + e(x - \bar{x}) + f(y - \bar{y})$$

where $\bar{x}$ and $\bar{y}$ are the average x and y coordinate values within the ROI. Using the pixel values within the ROI in this time frame, the parameters a, b, c, d, e, and f are estimated, for example using a least square fit. From the model, then, the fit values for x average velocity, $dv_x/dx$, $dv_x/dy$, y average velocity, $dv_y/dx$ and $dv_x/dy$ are a, b, c, d, e, and f, respectively.

Thus, for each frame i, the incremental longitudinal strains, $\Delta\epsilon_{xx,i}$ and $\Delta\epsilon_{yy,i}$, the displacement $\Delta x_i$ and $\Delta y_i$, the rotation $\Delta\alpha_i$ and the shear strain $\Delta\theta_i$ are calculated. The strain tensor so computed, $\epsilon$, is:

$$\epsilon = \begin{bmatrix} \Delta\epsilon_{xx,i} & \Delta\theta_i/2 \\ \Delta\theta_i/2 & \Delta\epsilon_{yy,i} \end{bmatrix}$$

with respect to the "laboratory" coordinate system and must be rotated by $-\alpha$ to be consistent with that of the first frame. This rotation produces the rotated strain tension $\epsilon'$, and the rotated longitudinal and shear strains for this frame, $\Delta\epsilon'_{xx,i}$, $\Delta\epsilon'_{yy,i}$ and $\Delta\theta'_i$:

$$\epsilon' = \begin{bmatrix} \Delta\epsilon'_{xx,i} & \Delta\theta'_i/2 \\ \Delta\theta'_i/2 & \Delta\epsilon'_{yy,i} \end{bmatrix}$$

The running total longitudinal strains $\epsilon_{xx}$, $\epsilon_{yy}$ and total shear strain $\Delta\theta$ are then incremented by $\Delta\epsilon'_{xx,i}$, $\Delta\epsilon'_{yy,i}$ and $\Delta\theta'_i$, respectively.

Note that for the first frame $\alpha=0$ and the rotation has no impact. As will be clear below, however, for other frames $\alpha$ may be non-zero.

Following this, and in preparation for the next frame, the net translations $\Delta x$ and $\Delta y$, and the net rotation $\alpha$ are incremented by $\Delta x_i$, $\Delta y_i$, and $\Delta\alpha_i$, respectively.

If the frame counter indicates that all frames have been processed, the computations are complete. Otherwise, the original ROI shape is translated by $\Delta x$ and $\Delta y$, rotated by $\alpha$, deformed by $\epsilon_{xx}$, $\epsilon_{yy}$, and $\theta$ and the next frame is processed.

Images can then be constructed to depict the sample region of interest over time based on and displaying computed displacements, rotations, and strains.

Figure 3:
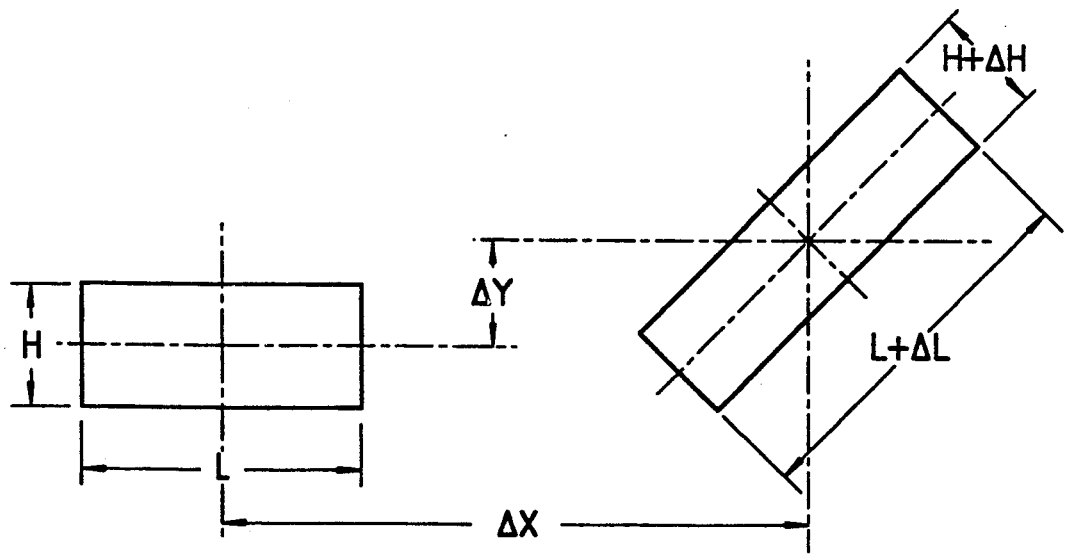
FIG. 3 illustrates movement of a region of interest between frames and the measure and calculated parameters of the movement in accordance with the invention.

FIG. 3 illustrates measured and calculated parameters of a region of interest (ROI) 10 of width W and height H in frame i and in frame i+1. Between frames the ROI is translated $\Delta x$ and $\Delta y$, rotates by $\alpha$, elongates by $\Delta L$, and shortens by $-\Delta H$. While not shown, the ROI might also have experienced shear. The various calculated parameters from FIG. 2 can be used for cine assessment of the motion.

By obtaining measurements and calculations along three axes (x, y, z), the motions and distortions, and twistings of the myocardium during a cardiac cycle can be assessed and visualized.

As was discussed previously, the spatial resolution with which a myocardial sample can be tracked in accordance with the invention is limited by image noise and is relatively insensitive to pixel size. The spatial resolution required in the images for sufficient performance of myocardial tracking is not dependent on the dimensions of the displacements measured, but rather on the dimensions over which motion velocities vary significantly. Similarly, to measure strain adequately image resolution capable of characterizing the spatial variations is required in these parameters. This is in contrast to measurements with radiopaque markers or MRI measurements with the prior art tagging technique, where the precision of measured displacements depends directly on the ability to localize points, and this in turn is controlled by the spatial resolution of the system and the dimensions of the (radiopaque or magnetic) marker. The method of the present invention also has the additional advantage of avoiding the need for sophisticated algorithms to automatically detect marker locations.

Figure 4:
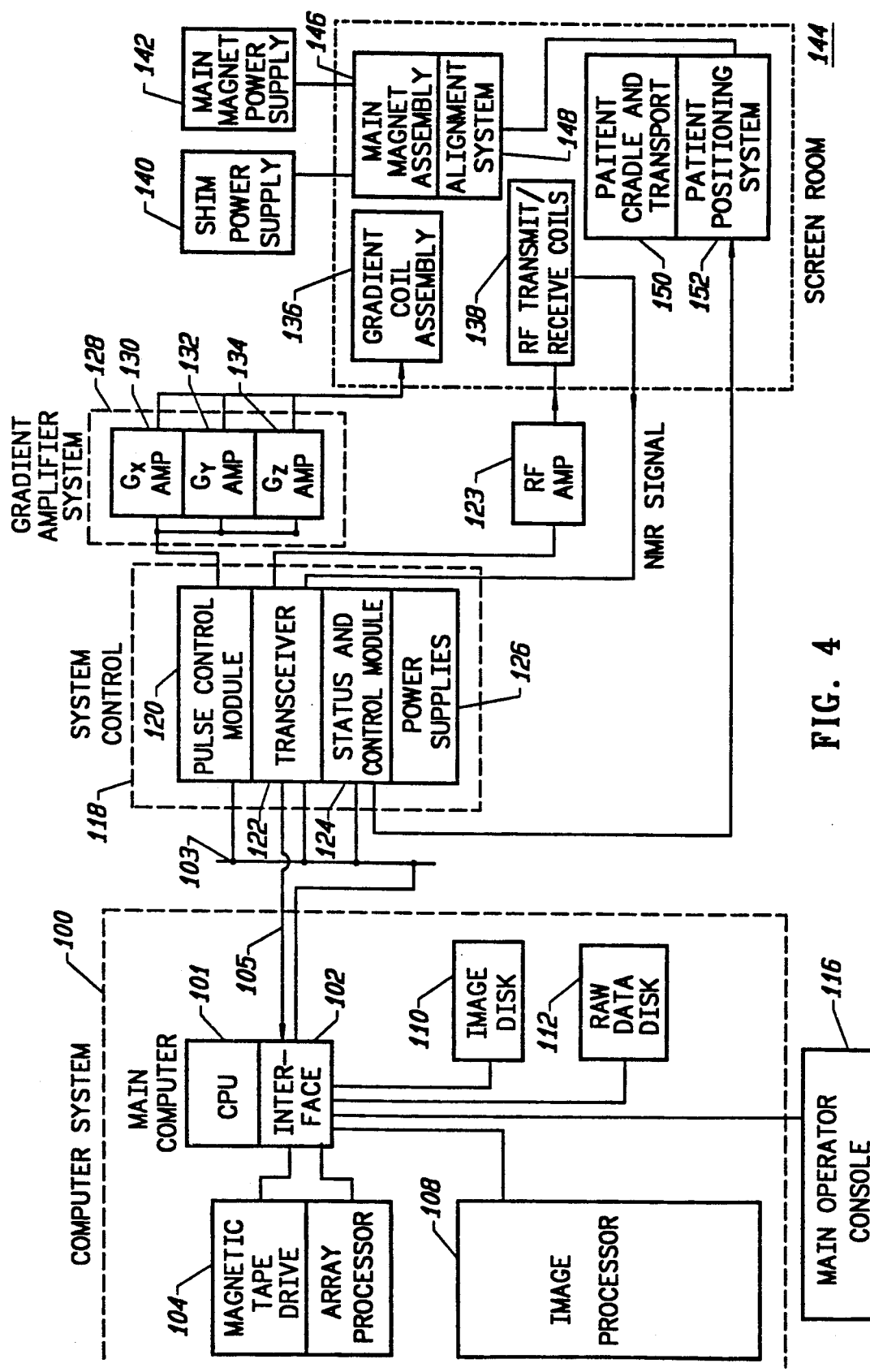
FIG. 4 is a block diagram of NMR system which employs the invention.

Referring to FIG. 4, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spins in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 5:
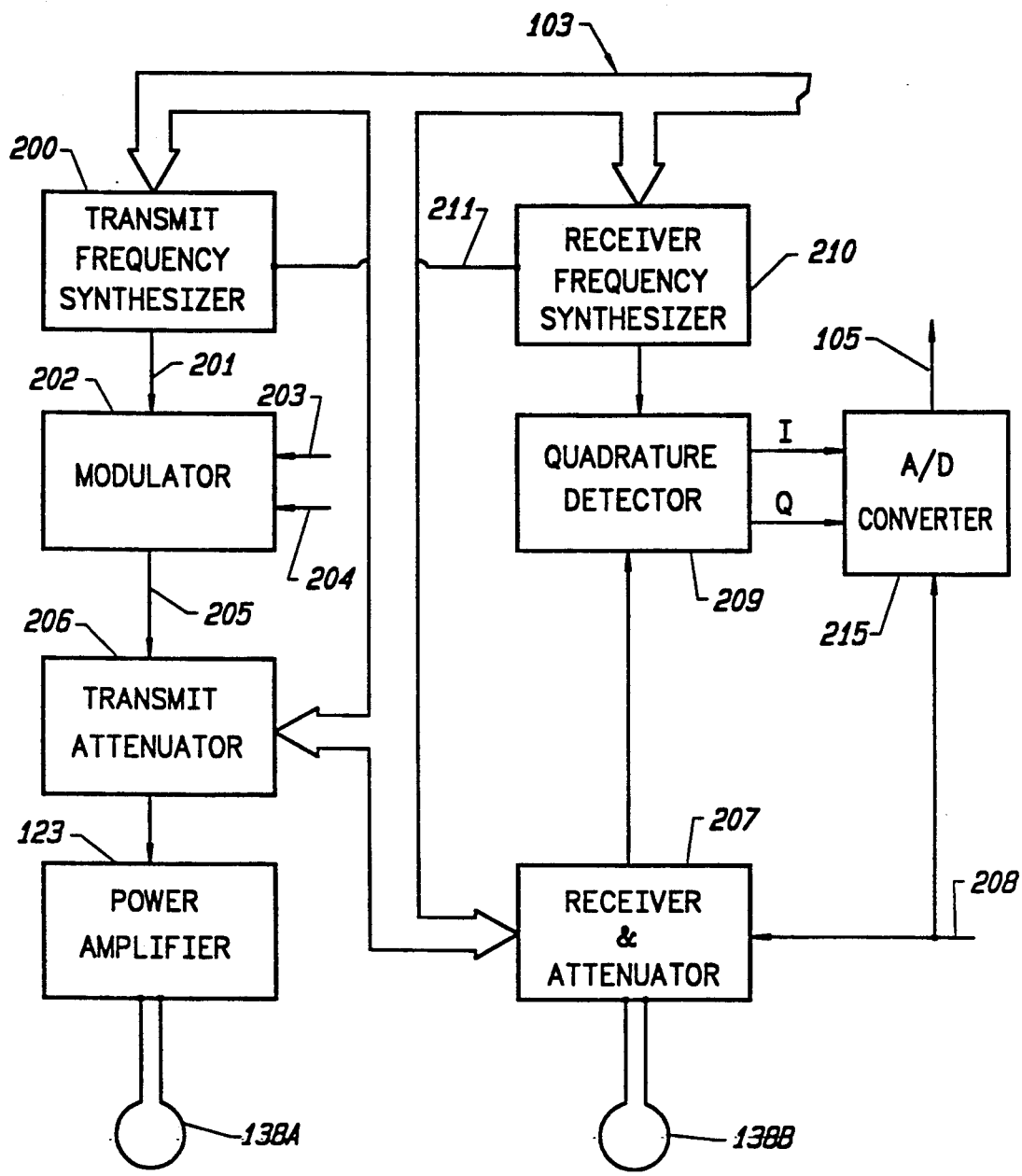
FIG. 5 is an electrical block diagram of the transceiver which forms part of the NMR system of FIG. 4.

Referring particularly to FIGS. 4 and 5 the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

The NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the RF reference (I signal) and the amplitude of that component of the NMR signal which is in quadrature therewith (Q signal).

The I and Q components of the received NMR signal are continuously sampled and digitized by the A/D converter 218 at a sample rate of 64 kHz throughout the acquisition period. A set of 256 digital numbers are simultaneously acquired for each I and Q component of the NMR signal, and these digital numbers are conveyed to the main computer 101 through the serial link 105. Each pair of numbers is thought of as a complex value equal to I+iQ. The NMR system of FIG. 4 performs a series of pulse sequences to collect sufficient NMR data to reconstruct the desired images as described above.

There has been described an improved method and apparatus for assessing myocardial motion based on phase contrast magnetic resonance imaging by recursively tracking individual myocardial samples and the distortions within these samples in a plurality of frames in a cardiac cycle. Also, a method for producing images dependent on the rate of strain development has been described. The invention has applicability in studying movement of other organs and muscles, as well as in the study of non-biological samples.

Thus, while the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

I claim:

1. A method of assessing motion of a region within an object, using magnetic resonance measurements, comprising the steps of
    a) positioning said object in a magnetic field,
    b) obtaining magnetic resonance image signals representative of at least one velocity component of said region at a plurality of time frames,
    c) identifying a position of said region in said image signals at one time frame,
    d) estimating a new position of said region in a time frame other than said one time frame using said at least one velocity component,
    e) translating said region to said new position, and
    f) repeating steps d) and e) for succeeding time frames to determine the motion for said region.

2. The method as defined by claim 1 and further including
    g) forming cine images of said motion of said region.

3. The method as defined by claim 2 wherein steps c)–g) are repeated for other regions.

4. The method as defined by claim 1 and wherein steps c)–f) are repeated for other regions.

5. The method as defined by claim 1 wherein said magnetic field includes time varying magnetic gradients along a plurality of axes and said motion of said region is along said plurality of axes.

6. A method of assessing motion and deformation of a region within an object comprising the steps of
    a) positioning said object in a magnetic field,
    b) obtaining magnetic resonance image signals representative of at least one velocity component of said region at a plurality of time frames,
    c) identifying a position of said region in said image signals at one of said plurality of time frames,
    d) calculating parameters derived from said at least one velocity component within said region at said one time frame,
    e) estimating a new position and a new shape of said region in a time frame other than said one time frame based on said velocity parameters,
    f) translating said region to said new position,
    g) deforming said region at said new position, and
    h) repeating steps d)–g) for succeeding time frames to determine motion and deformation of said region.

7. The method as defined by claim 6 wherein said parameters calculated in step d) include average and spatial gradients of the velocity components.

8. The method as defined by claim 6 wherein step d) includes modelling velocity, $v_x$, and velocity, $v_y$, as $$v_x = a + b(x-x) + c(y-y);$$

$$v_y = d + e(x-x) + f(y-y);$$

where a, b, c, d, e, and f) are constants calculated by at least squares fit over said region in each of said frames.

9. The method as defined by claim 8 wherein step d) further includes calculating in each of said frames changes in longitudinal strain as $$\Delta\epsilon_{x,xi} = b\Delta t;$$

$$\Delta\epsilon_{y,yi} = f\Delta t;$$

changes in displacement as $$\Delta x_i = a \Delta t$$

$$\Delta y_i = d \Delta t$$

changes in rotation as $$\Delta\alpha_i = \frac{1}{2}[(e\Delta t)-(c\Delta t)]$$

and changes in shear as $$\Delta\theta_i = [(e\Delta t)+(c\Delta t)].$$

10. The method as defined by claim 9 and further including a step of (i) combining the motion and deformation determined in said plurality of time frames.

11. The method as defined by claim 10 wherein said region has a coordinate system and wherein step i) further includes rotation of the coordinate system for said region between said time frames in estimating a combined new position and a new shape of said region.

12. The method as defined by claim 11 and further including j) forming cine images of said motion and deformation of said region.

13. The method as defined by claim 12 wherein steps c)–j) are repeated for other regions.

14. A method of assessing deformation of a region within an object comprising the steps of
   a) positioning said object in a magnetic field,
   b) obtaining magnetic resonance image signals representative of a plurality of velocity components of said region at a plurality of frames,
   c) calculating parameters related to said velocity components at a plurality of points within said region, and
   d) assessing deformation of said region at said plurality of time frames based on spatial derivatives of velocity.

15. The method as defined by claim 14 wherein step (d) includes forming an image related to rate of development of strain within said region.

16. Apparatus for assessing motion of a region within an object comprising
   first means for (a) establishing a magnetic field within said object,
   second means for (b) obtaining magnetic resonance image signals representative of at least one velocity component of said region at a plurality of time frames,
   third means for (c) identifying the position of said region in the image signal at one of said plurality of time frames,
   fourth means for (d) estimating a new position of said region in a time frame other than said one time frame, and
   fifth means for (e) translating said region to said new position.

17. Apparatus for assessing motion and deformation of a region within an object comprising
   first means for establishing a magnetic field within said object,
   second means for obtaining magnetic resonance image signals representative of at least one velocity component of said region at a plurality of time frames,
   third means for identifying a position and shape of said region in said image signals at one of said plurality of time frames,
   fourth means for calculating parameters derived from velocity components within said region at said one time frame,
   fifth means for estimating a new position and a new shape of said region in a time frame other than said one time frame based on said velocity parameters,
   sixth means for translating said region to said new position, and
   seventh means for deforming said region at said new position.

18. Apparatus as defined by claim 17 wherein said fourth means models velocity, $v_x$, and velocity, $v_y$, as $$v_x = a + b(x-x) + c(y-y)$$

$$v_y = d) + e(x-x) + f(y-y)$$

where a, b, c, d, e, and f) are constants calculated by a least squares fit over said region in each frame.

19. Apparatus as defined by claim 18 wherein said fourth means calculates in each of said frames changes in longitudinal strain as $$\Delta \epsilon_{x,xi} = b\Delta t;$$

$$\Delta \epsilon_{y,yi} = f\Delta t;$$

changes in displacement as $$\Delta x_i = a \Delta t;$$

$$\Delta y_i = d \Delta t;$$

changes in shear as $$\Delta \theta_i = ](e\Delta t)] + (c\Delta t)];$$

and changes in rotation as $$\Delta \alpha = \tfrac{1}{2}[(e\Delta t) - (c\Delta t)].$$

20. Apparatus as defined by claim 19 wherein said region has a coordinate system and said fifth means rotates the coordinate system for said region between said frames in estimating said new position and said new shape of said region.

21. Apparatus as defined by claim 20 and further including ninth means for forming cine images of said motion and deformation of said region.

22. Apparatus for assessing deformation of a region within an object comprising
   first means for (a) establishing a magnetic field through said object,
   second means for (b) obtaining magnetic resonance image signals representative of a plurality of velocity components of said region at a plurality of frames,
   third means for (c) calculating parameters related to said velocity components at a plurality of points within said region, and
   fourth means for (d) assessing deformation of said region at said plurality of time frames based on spatial derivatives of said velocity components.

23. Apparatus as defined by claim 22 wherein said fourth means includes means for forming an image related to rate of development of strain within said region.

* * * * *

UNITED STATES PATENT AND TRADEMARK OFFICE
CERTIFICATE OF CORRECTION

PATENT NO.    : 5,195,525

DATED         : March 23, 1993

INVENTOR(S)   : Norbert J. Pelc

It is certified that error appears in the above-identified patent and that said Letters Patent is hereby corrected as shown below:

in the Drawing, Fig. 2, third box from the bottom, the top line should read:

--CALCULATE $\Delta\epsilon'xxi, \Delta\epsilon'yyi, \Delta\theta'i$-- in the Specification:

Col. 6, lines 40 and 42, should read:

--$da/dt = \frac{1}{2}(dv_y/dx - dv_x/dy)$
$d\theta/dt = (dv_y/dx + dv_x/dy)$--

Signed and Sealed this

Twelfth Day of January, 1999

Attest:

Attesting Officer        *Acting Commissioner of Patents and Trademarks*